(12) United States Patent
Greene et al.

(10) Patent No.: US 7,883,948 B2
(45) Date of Patent: *Feb. 8, 2011

(54) METHOD AND STRUCTURE FOR REDUCING INDUCED MECHANICAL STRESSES

(75) Inventors: Brian J. Greene, Wappingers Falls, NY (US); Rajesh Rengarajan, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/465,817

(22) Filed: May 14, 2009

(65) Prior Publication Data

US 2009/0236640 A1 Sep. 24, 2009

Related U.S. Application Data

(63) Continuation of application No. 11/937,637, filed on Nov. 9, 2007, now Pat. No. 7,572,689.

(51) Int. Cl.
*H01L 21/337* (2006.01)
(52) U.S. Cl. ............... 438/188; 438/199; 257/E21.632
(58) Field of Classification Search .................. 438/150, 438/153, 154, 188, 198, 199, 279, 587, 699; 257/E21.632
See application file for complete search history.

(56) References Cited

U.S. PATENT DOCUMENTS

| | | | |
|---|---|---|---|
| 7,101,744 B1 | 9/2006 | Dyer et al. | |
| 7,572,689 B2 * | 8/2009 | Greene et al. | 438/188 |
| 2004/0185609 A1 | 9/2004 | Okumura et al. | |
| 2004/0262784 A1 | 12/2004 | Doris et al. | |
| 2005/0059260 A1 | 3/2005 | Bu et al. | |
| 2005/0093059 A1 | 5/2005 | Belyansky et al. | |
| 2005/0093076 A1 | 5/2005 | Steegen et al. | |
| 2005/0136583 A1 | 6/2005 | Chen et al. | |
| 2005/0148133 A1 | 7/2005 | Chen et al. | |
| 2005/0148134 A1 | 7/2005 | Dokumaci et al. | |

* cited by examiner

*Primary Examiner*—Quoc D Hoang
(74) *Attorney, Agent, or Firm*—DeLio & Peterson, LLC; Kelly M. Nowak; Ian D. MacKinnon

(57) ABSTRACT

Methods and structures for relieving stresses in stressed semiconductor liners. A stress liner that enhances performance of either an NFET or a PFET is deposited over a semiconductor to cover the NFET and PFET. A disposable layer is deposited to entirely cover the stress liner, NFET and PFET. This disposable layer is selectively recessed to expose only the single stress liner over a gate of the NFET or PFET that is not enhanced by such stress liner, and then this exposed liner is removed to expose a top of such gate. Remaining portions of the disposable layer are removed, thereby enhancing performance of either the NFET or PFET, while avoiding degradation of the NFET or PFET not enhanced by the stress liner. The single stress liner is a tensile stress liner for enhancing performance of the NFET, or it is a compressive stress liner for enhancing performance of the PFET.

17 Claims, 5 Drawing Sheets

METHOD AND STRUCTURE FOR REDUCING INDUCED MECHANICAL STRESSES

BACKGROUND OF THE INVENTION

1. Field of the Invention

The present invention relates to semiconductors, and in particular, to methods and structures for selectively removing stressed liners to relieve mechanical stresses.

2. Description of Related Art

It is known that mechanical stresses can modulate performance of a semiconductor device, such as, a metal-oxide-semiconductor field effect transistor (MOSFET), for enhancing the characteristics thereof. In particular, it is known that the electron mobility of an n-type MOSFET (NFET) formed on silicon with a (001) surface orientation is enhanced when tensile stress is applied in the direction of current flow (e.g. longitudinal stress) and/or in the direction perpendicular to, but in the plane of current flow (e.g. transverse stress), and/or when compressive stress is applied in the direction normal to the plane of current flow (e.g. vertical stress) in the MOSFET channel. In addition, it is known that the hole mobility of a p-type MOSFET (PFET) formed on silicon with surface oriented in the (001) crystal plane, and <110> gate orientation is enhanced when a compressive longitudinal stress is applied, and/or when tensile transverse or vertical stresses are applied in the MOSFET channel.

To selectively create tensile stress in an NFET and compressive stress in a PFET, distinctive processes and different combinations of materials are used. Again, this is because the type of stress that is beneficial for the performance of an NFET is generally disadvantageous for the performance of the PFET formed in the same substrate. For instance, when a device is in tension (in the direction of current flow in a planar device), the performance characteristics of the NFET are enhanced, while the performance characteristics of the PFET are diminished.

Previous attempts at creating mechanical stresses for enhanced device performance have required NFET and PFET devices to be individually optimized, either to enhance both NFET and PFET, or to enhance one while minimizing the degradation of the other. These prior art approaches include numerous processing steps to form trench isolation structures that include dual stress liners. These dual stress liners typically include a first stress layer in the NFET regions made from a first sequence of steps, followed by second stress layer in the PFET regions made from another sequence of steps. Other known approaches include those that add stressed layers directly on top of the MOSFET for selectively inducing the appropriate strains in the channels of the FET devices.

While these methods do provide structures that have tensile stresses being applied to the NFET device and the compressive stresses being applied along the longitudinal direction of the PFET device, they often require numerous additional processing steps, additional materials, and/or more complex processing. Overall, the disadvantages of the prior art approaches is that they are time consuming and expensive. Further, in many cost sensitive applications, it is more advantageous to enhance the NFET (PFET), while only mitigating the degradation of the PFET (NFET), if such a solution could be realized at low cost/complexity. Thus, it is desired to provide more cost-effective and simplified methods for creating large tensile and compressive stresses in the channels of NFETs and PFETs, respectively.

SUMMARY OF THE INVENTION

Bearing in mind the problems and deficiencies of the prior art, it is therefore an object of the present invention to provide methods and structures for selectively removing stressed liners to relieve induced mechanical stresses.

It is another object of the present invention to provide methods and structures that significantly reduce processing complexity in removing induced mechanical stresses, while avoiding degradation of FET performance.

A further object of the invention is to provide methods and structures for easily and cost effectively selectively removing stressed liners.

Another object of the invention is to provide methods and structures for providing compression in the longitudinal orientation, for the PFET, while mitigating the NFET degradation by substantially reducing the vertical stress induced by the stress liner.

Still other objects and advantages of the invention will in part be obvious and will in part be apparent from the specification.

The above and other objects, which will be apparent to those skilled in the art, are achieved in the present invention, which is directed to a method of relieving stresses in stressed semiconductor liners. The method includes providing a semiconductor structure having a first and second FET, followed by providing and depositing a stress liner that enhances performance of the first FET over an entire surface of the semiconductor structure. A disposable layer is then deposited over the single stress liner, which is then recessed to expose only the upper portion of the single stress liner only over at least the second FET. This exposed single stress liner is removed from over the at least second FET to expose a top surface of a gate of the second FET. Any remaining portions of the disposable layer are then removed, thereby enhancing performance of the first FET while avoiding degradation of the second FET.

In accordance with the invention, the second FET may be an NFET while the first FET is a PFET on an (001) oriented silicon surface. In this aspect, the single stress liner comprises a single compressive stress liner for enhancement of the PFET. Alternatively, the first FET may be an NFET with the second FET a PFET on an (011) oriented silicon surface. In this aspect of the invention, the single stress liner is a single tensile stress liner for enhancement of the NFET. In either embodiment, the single compressive stress liner may include a dielectric material such as, for example, silicon nitride, silicon oxide, and the like.

The invention may further include protecting the first FET at least during the step of removing the single stress liner from over the second FET. The first FET may also be protected during the step of recessing the disposable layer to expose only the single stress liner over the second FET and during the step of removing the single stress liner from over the second FET.

The disposable layer of the invention may include, but is not limited to, an antireflective coating, spin-on glass, photoresist, reflowable oxides, reflow-able acrylic, and the like. The disposable layer is preferably deposited to a thickness sufficient to entirely cover the single stress liner and the first and second FETs. Optionally, the disposable layer may need to be planarized after deposition thereof. In accordance with the invention, the disposable layer may be recessed down to the top surface of the gate or immediately below the top surface of the gate. Optionally, a neutral stress liner may be deposited over the surface of the semiconductor structure after the remaining portions of the disposable layer have been removed.

Another method of the invention is for relieving stresses in stressed semiconductor liners. This method includes providing a semiconductor structure having an NFET and a PFET, followed by providing and depositing a stress liner that enhances performance of either the NFET or the PFET. This stress liner covers both the NFET and PFET. A disposable layer is deposited to entirely cover the single stress liner and both the NFET and the PFET. This disposable layer is then selectively recessed to expose only the single stress liner over a gate of the NFET or the PFET that is not enhanced by the deposited single stress liner. The exposed single stress liner is then removed to expose a top surface of the gate. Any remaining portions of the disposable layer are then removed. This method enhances performance of either the NFET or the PFET, while avoiding degradation of the NFET or the PFET that is not enhanced by the single stress liner.

In this aspect of the invention, the single stress liner may be a tensile stress liner for enhancement performance of the NFET, or it may be a compressive stress liner for enhancement performance of the PFET.

In still another aspect, the invention is directed to an intermediate semiconductor structure that includes a semiconductor structure having first and second FET devices, respectively, having first and second gates. In this intermediate product, a single stress liner resides over a surface of the semiconductor structure, over the first FET gate, and not over the second FET gate. In so doing, the single stress liner enhances performance of the first FET device while avoiding degradation of performance of the second FET device. The single stress liner may be a tensile stress liner when the first FET is an NFET and the second FET is a PFET on an (011) oriented silicon surface. Alternatively, the single stress liner may be a compressive stress liner when the first FET is a PFET on an (001) oriented silicon surface and the second FET is a NFET.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-8 of the drawings in which like numerals refer to like features of the invention.

Figure 1:
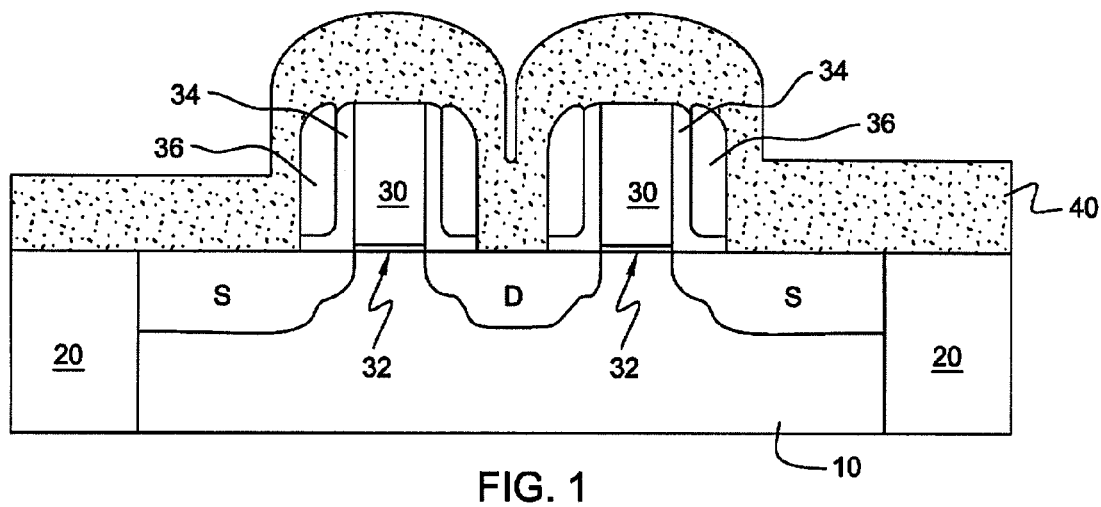
FIGS. 1-5 show cross sectional views of one embodiment of a process flow and structure of the invention for relieving vertical stresses in nitride liners.

Referring to the drawings, FIG. 1 shows a cross sectional view of a portion a semiconductor device having a transistor body with a pair of NFET devices. The semiconductor is formed by conventional techniques using a substrate 10 of any known material including silicon, strained silicon, silicon germanium, germanium, silicon on insulator, or any other semiconductor substrate. An isolation device 20, such as shallow trench isolation (STI), is formed on the substrate 10 for defining n-well and p-well regions of the substrate.

A gate dielectric 32 along with the gate electrodes 30 are formed over the substrate by known techniques. For instance, first a gate dielectric layer is grown or deposited over the substrate followed by deposition of a semiconductor, metal, or silicide material (e.g. silicon or germanium TiN, W, Ru, Rh, Re, NiSi) for the gates. A photo-resist layer is deposited and patterned into sections over desired PFET (not shown) and NFET gate electrode areas, which then protects the underlying gate electrode from the reactive ion etch employed to transfer this pattern into the gate electrodes and the gate dielectrics for the PFET and NFET devices.

FIG. 1 shows the gate electrodes 30 and gate dielectrics 32 for a pair of PFET devices or a pair of NFET devices on the substrate. First and second sets of spacers 34, 36 are formed on opposing sides of each gate electrode 30 and gate dielectric 32 stack for implantation of the source and drain regions. Spacers 34, 36 may respectively comprise silicon dioxide and silicon nitride.

A stress liner 40 may then be formed over the substrate for optimization of the PFET device performance. Depending on whether the transistors are PFETs or NFETs, the stress liner will comprise either a compressive stress liner or a tensile stress liner, respectively. Again, as described above, the type of stress that is beneficial for the performance of the PFET is generally disadvantageous for the performance of the NFET, and vice versa.

Conventional approaches for selectively forming stress liners (i.e., compressive stress liners for PFETs and tensile stress liners for NFETs) typically involve numerous processing steps for depositing compressive liners on PFET regions and then selectively removing the compressive liner from the NFET regions, followed by depositing tensile liners on NFET regions then selectively removing the tensile liner from the PFET regions. These approaches also utilize different combinations of materials to ensure each device is optimally stressed. For instance, in order to form a compressive liner for the PFET device, an additional oxide or nitride film may be needed to protect the NFET regions from being attacked during the selective removal of the compressive liner from the NFET regions, followed by yet another protection layer to prevent similar damage to the PFET which would otherwise occur when the tensile liner is removed from PFET regions. Overall, conventional approaches for forming stress liners are timely and expensive. There are many applications where the additional expense in both process costs and yield loss outweigh the performance improvements such a structure provides.

The present invention overcomes these problems by providing a simplified structure and approach for optimizing either the NFET or PFET performance individually with a single stressed liner integration, while mitigating much of the performance degradation of the non-targeted device (i.e. the PFET under tensile liner, or NFET under compressive liner) typically observed with single stress liners. In so doing, a single stress liner 40 is deposited over the entire substrate surface to cover both NFET and PFET regions. The single stress liner 40 may be a compressive stressed liner for enhancement of the PFET devices, or it may be a tensile stressed liner for enhancement of the NFET devices. Compressive and tensile stressed liners may include, but are not limited to, a compressive stressed nitride contact etch stop layers (e.g., silicon nitrides), stressed oxides layers (e.g., silicon oxides), and the like. For ease of understanding, the following description of the invention is explained in reference first to optimization of PFET devices, followed by optimization of NFET devices.

In enhancing performance of PFET devices, the transistors of FIG. 1 will represent NFET devices. The single stressed liner 40 comprises a compressive stressed liner deposited over the entire surface of the substrate to cover both PFET regions and NFET regions. While the PFET devices favor the compressive stressed liner, the NFET devices do not favor such layer.

Figure 2:
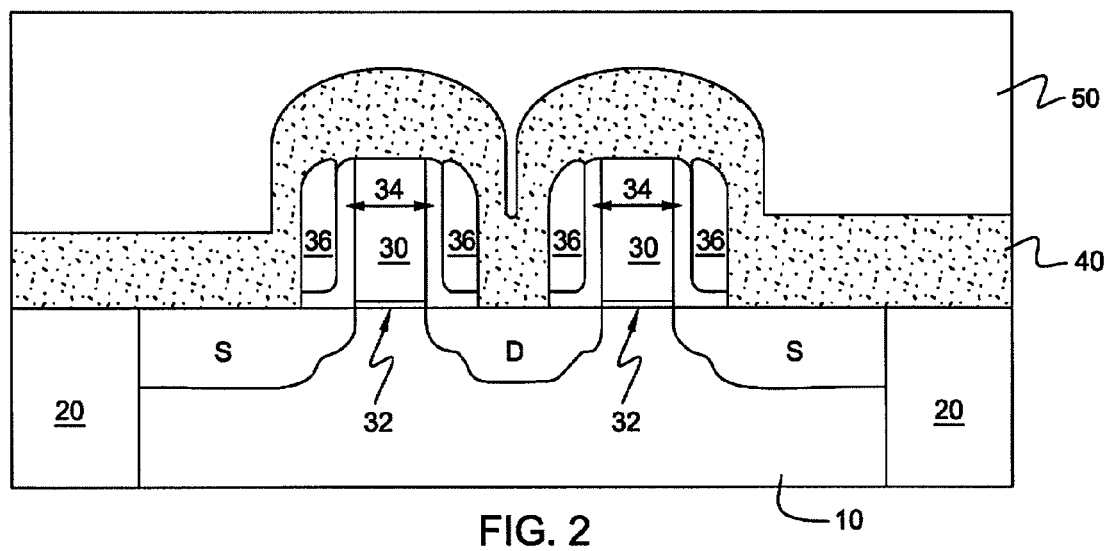

Referring to FIG. 2, a planar disposable layer 50 is directly deposited over the entire surface of the stress liner 40 for removing any compressive stress liner from over the NFET gates. The disposable layer 50 is preferably any type of self-planarizing material capable of protecting underlying layering and circuitry, as well as being easily removed from the substrate, including, but not limited to, any anti-reflective coatings (ARC), spin-on glass, photoresist, reflowable oxides, reflow-able acrylic, and the like. For instance, a spin on ARC layer 50 may be deposited using standard lithography processes. The thickness of this disposable layer is a function of the gate/spacer and stress liner thicknesses, such that, it must be deposited in an amount sufficient to cover the entire stress liner 40, and in particular, to cover the stress liner 40 over both NFET and PFET gate regions. The disposable layer 50 is preferably planarized, and could also be obtained via deposited oxides which are later planarized through the use of CMP processing.

In accordance with the invention, the planar disposable layer 50 enables the selective removal of the compressive stress liner (stress liner 40) from over the gate regions, while protecting the compressive liner over the active silicon region. In another embodiment, the PFET regions may be patterned before the stress liner 40 is recessed, as discussed further below.

In the preferred embodiment, the planarizing disposable layer 50 is recessed until the compressive nitride covering the gates (both NFET and PFET) is exposed. However, the planarizing disposable layer is still present on the nitride that contacts the silicon substrate. The nitride is then selectively etched, such that the planarizing disposable layer 50 prevents the removal of nitride from the source and drain regions of the FET, while the nitride covering the gate is removed.

Figure 3:
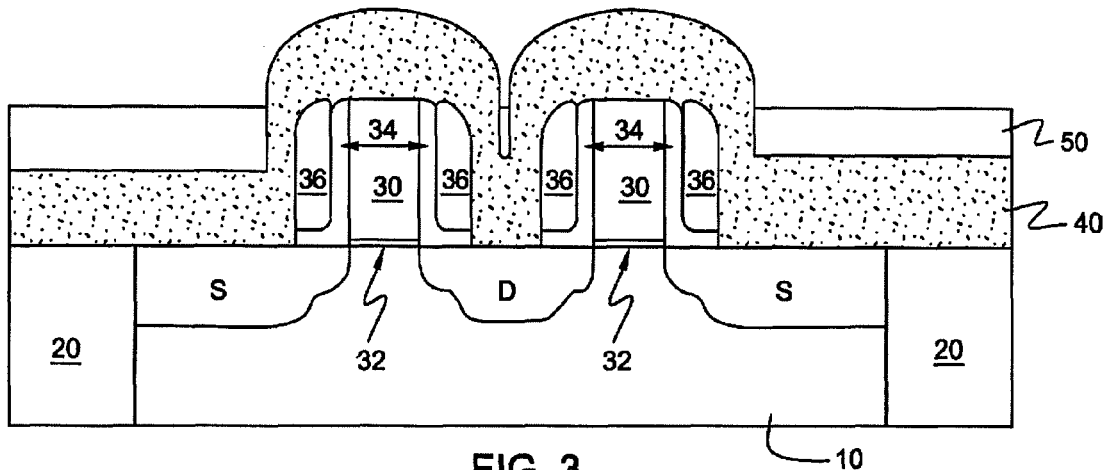

In a second embodiment, the PFET region may be patterned to protect the disposable layer 50 and the compressive stressed liner 40 in the PFET regions. The PFET region may be patterned using known lithography techniques to cover the PFET with resist. Once the PFET gates and their corresponding compressive stressed liners are protected, the exposed portion of the disposable layer 50 in the NFET regions is recessed to expose top portions of the stress liner 40 residing over the NFET gate regions (FIG. 3). This may be accomplished by etching (e.g., reactive ion etching) the disposable layer 50 to expose only the compressive stressed liner at the top of the NFET polysilicon gates. The disposable layer 50 is recessed until the surface thereof is level with a top surface of the NFET gate structures, or it may be recessed such that the top surface of the disposable layer 50 resides immediately below the top surface of the gate structures.

Figure 4:
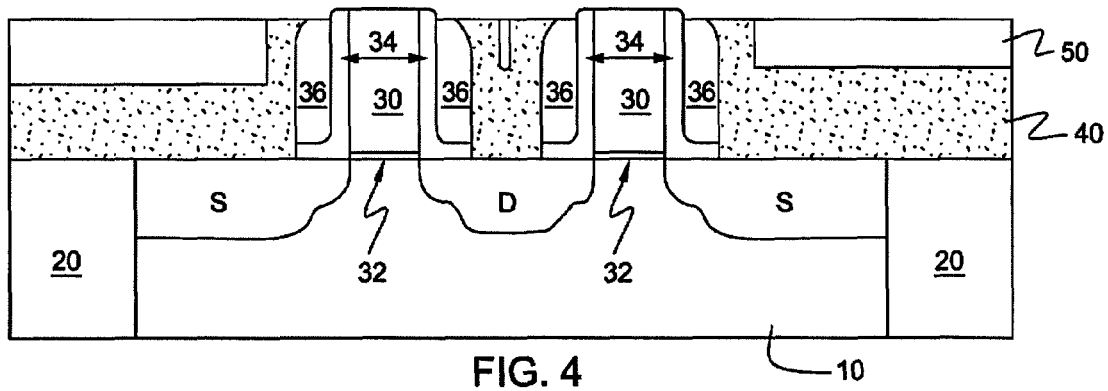
Figure 5:
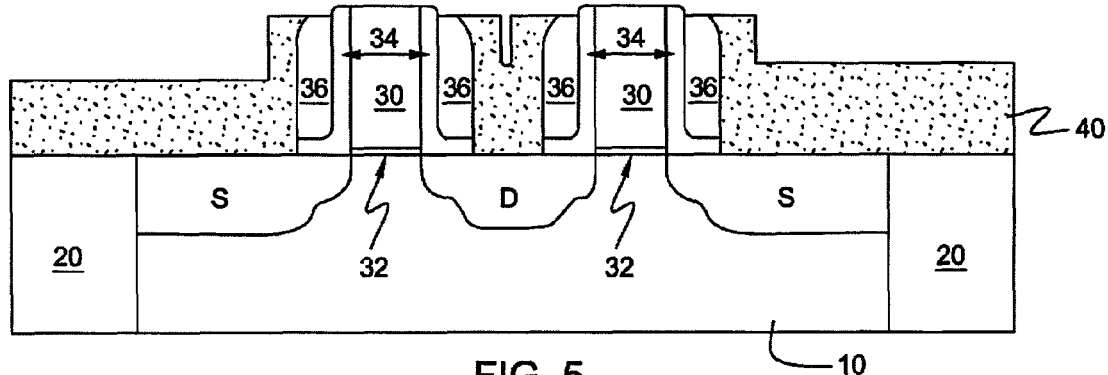

Referring to FIG. 4, with the PFET regions being protected, only the exposed top portions of the compressive stress liner residing over the NFET gate regions are then removed to expose the top of the NFET gates and their corresponding spacers. The stress liner may be removed using an anisotropic etch that is selective to the materials of the NFET gates and spacers.

The protective resist over the PFET regions is then removed, followed by removing all remaining portions of the disposable layer 50 from the entire surface area of the substrate. At this point, a neutral stress liner (e.g., a nitride) may be deposited over the substrate surface to serve as an etch stop for the exposed polysilicon gate during CA RIE, followed by known semiconductor processing techniques.

Alternatively, the disposable layer 50 may be recessed before patterning the PFET regions. In this aspect, the disposable layer 50 is recessed in both NFET and PFET regions to expose the compressive stress liner over both NFET gates and PFET gates. Again, the disposable layer 50 may be recessed down to a top surface of the gates, or just below the gates. The PFET regions are then covered to protect the PFET gates and their corresponding stress liners, followed by removal of the compressive stress liner only over the NFET gates to expose the top of the NFET gates and their corresponding spacers (FIG. 4). The protective covering (e.g., resist) over the PFET regions is then removed, followed by removal of all remaining portions of the disposable layer 50 from both NFET and PFET regions. The neutral stress liner may then be deposited, followed by continued semiconductor processing.

In either of the above approaches, the resultant semiconductor structure includes the single stress liner 40, in this aspect a single compressive stress liner, residing in both PFET and NFET regions, with the compressive stress liner residing only over the PFET gates for the optimization thereof (i.e., not over the NFET gates). In this manner, the performances of the PFET devices are enhanced, while simultaneously avoiding degradation in the NFET devices since this single stress liner does not reside over the NFET gates.

Rather than enhancing performance of the PFET devices, performances of the NFET devices may be enhanced using the approach and single stress liner of the invention. As stated earlier, planar PFETs formed on silicon with surface oriented in the (001) crystal plane are largely insensitive to vertical stress. However, planar PFETs formed on silicon with surface oriented in the (011) crystal plane are rather sensitive to vertically applied stress, with tensile vertical stress preferred for performance improvement. Hence, for devices built on silicon with surface oriented in the (011) crystal plane, employing a single tensile liner (which induces compressive vertical stress in the FET channels) for NFET performance optimization, a relative PFET improvement can be obtained by removing the tensile liner from the PFET gate. In this aspect, the structure of FIG. 1 represents a pair of PFET devices sharing a drain region. The single stressed liner 40 comprises a tensile stressed liner deposited over the entire surface of the substrate to cover both PFET regions and NFET regions. While the NFET devices favor the tensile stressed liner, the PFET devices do not favor such tensile liner.

As described above, the planar disposable layer 50 is directly deposited over the entire surface of this tensile stress liner for the selective removal of any tensile stress liner from over the PFET gates (FIG. 2). In so doing, the single tensile stress liner enhances the performance of the NFET device, while avoiding any degradation in the PFET devices. Since it is desired to remove the tensile stress liner from over the PFET gates, the NFET regions are covered to protect the tensile stress liner over the NFET gates. Like that described above, the NFET regions may be patterned and covered with resist either before or after recessing the disposable layer 50.

In detail, the NFET region may be patterned to protect the disposable layer 50 and the tensile stress liner 40 in the NFET regions. Exposed portions of the disposable layer 50 in the PFET regions are then recessed to expose top portions of the tensile stress liner residing over the PFET gates (FIG. 3). Again, this disposable layer 50 is recessed until the surface thereof is level with a top surface of the PFET gates, or it may be recessed such that the top surface of the disposable layer 50 resides immediately below the top surface of the PFET gates. With the NFET gates and corresponding tensile stress liner being protected, the exposed tensile stress liner over the PFET gates is now removed to exposed top portions of the PFET gates and corresponding spacers. The resist is removed from over the NFET regions, followed by removal of all remaining portions of the disposable layer 50 from the entire surface area of the substrate. Subsequent semiconductor processing may then continue.

Alternatively, the disposable layer 50 may be recessed before protecting the NFET regions. In this aspect, the disposable layer 50 is recessed in both NFET and PFET regions to expose the tensile stress liner over both NFET gates and PFET gates. The NFET regions are then covered to protect the NFET gates and their corresponding tensile stress liners. The exposed tensile stress liner over the PFET gates is then removed, thereby exposing the top of the PFET gates and their corresponding spacers (FIG. 4). The protective coating over the NFET regions is removed, followed by removal of all remaining portions of the disposable layer 50 from both NFET and PFET regions. The resultant semiconductor structure includes a single tensile stress liner 40 only over the NFET gates for the optimization thereof, while avoiding degradation of the PFET gates. Again, a neutral stress liner may then be deposited, followed by continued semiconductor processing.

In accordance with the invention, both the PFET and NFET devices are optimized using a single stress liner that is either a compressive liner or a tensile liner that resides only over either the PFET gates or the NFET gates, respectively, for the enhancement and optimization thereof. Wherein the invention is used to mitigate NFET performance degradation with single compressive liners, since the (001) silicon PFET is insensitive to vertical stress (the vertical piezoresistance coefficient is −0.02× that of the NFET), the PFET's performance is negligibly affected while the NFET performance is improved (e.g., (001) PFET vertical stress piezoresistance coefficient is −1.1e-12 cm2/dyne while (001) NFET vertical stress piezoresistance coefficient is 54.3e-12 cm2/dyne). Similarly, wherein the invention is used to mitigate (011) silicon PFET performance degradation with single tensile liners, since the tensile liners induce compressive vertical stress and the (011) silicon PFET is strongly otherwise strongly degraded by this stress liner configuration (e.g., (011) PFET vertical stress piezoresistance coefficient is −66.3e-12 cm2/dyne, 60 times the (011) PFET vertical stress sensitivity).

Figure 6A:
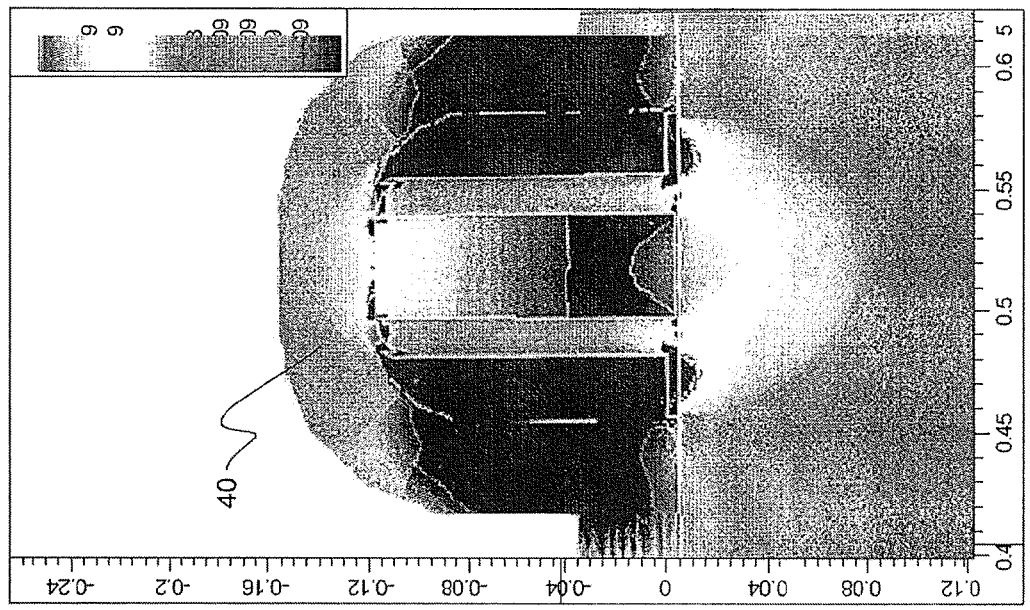
FIGS. 6A-7B are cross sectional views of a simulated schematic showing the improved results of the invention as compared to a control structure.
Figure 6B:
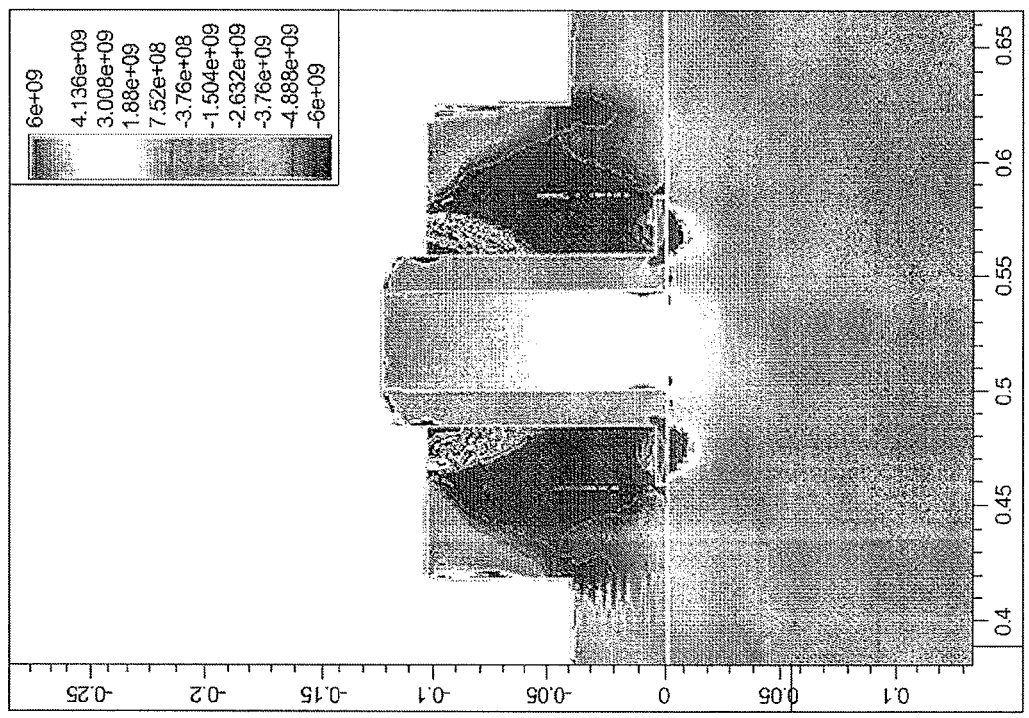
Figure 7A:
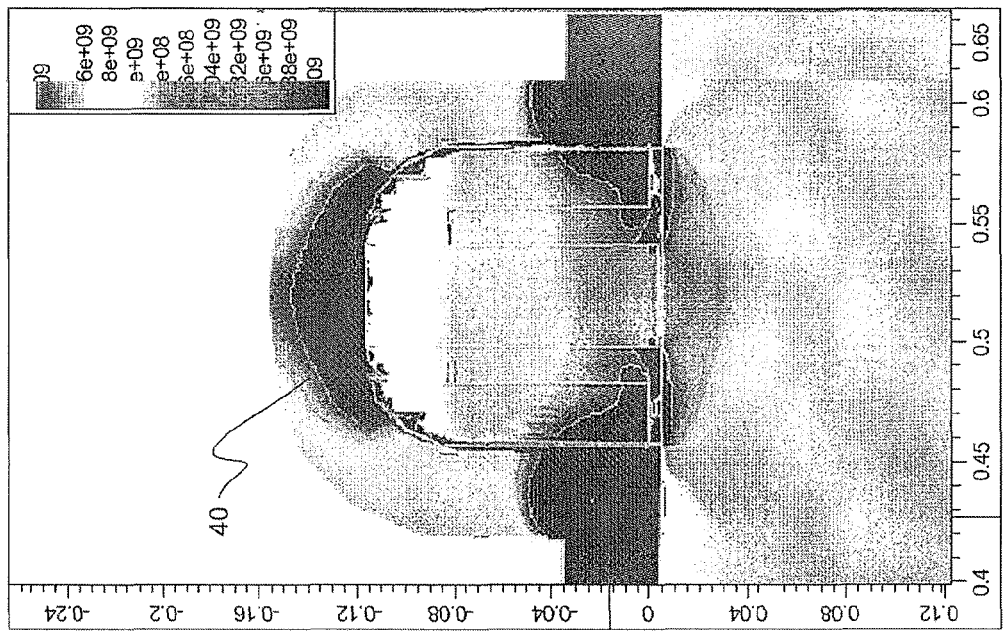
Figure 7B:
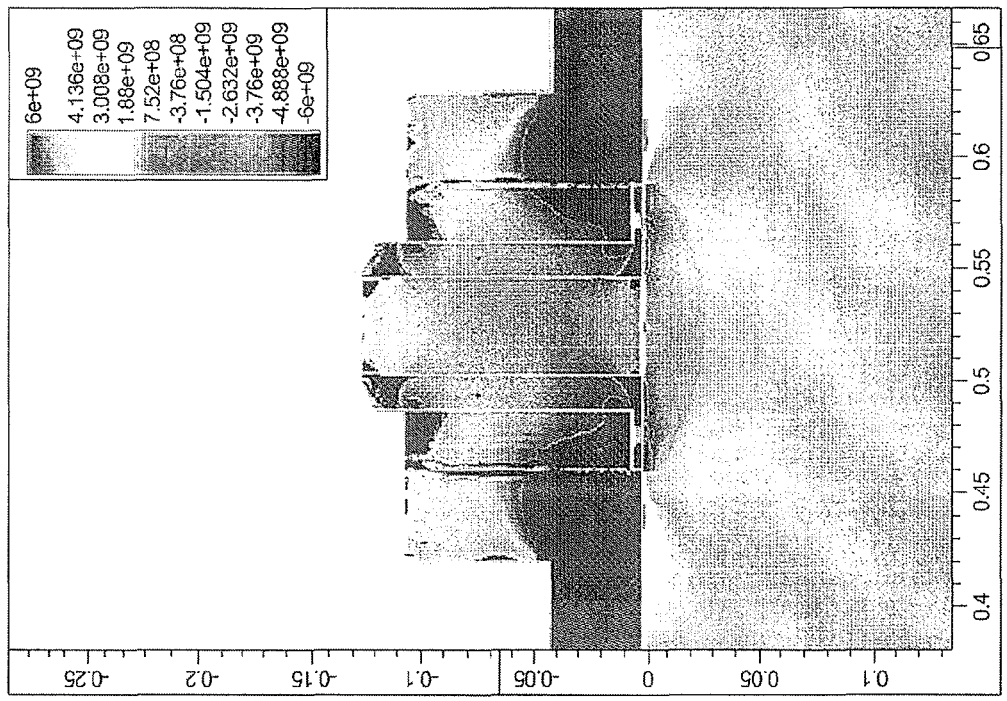
Figure 8:
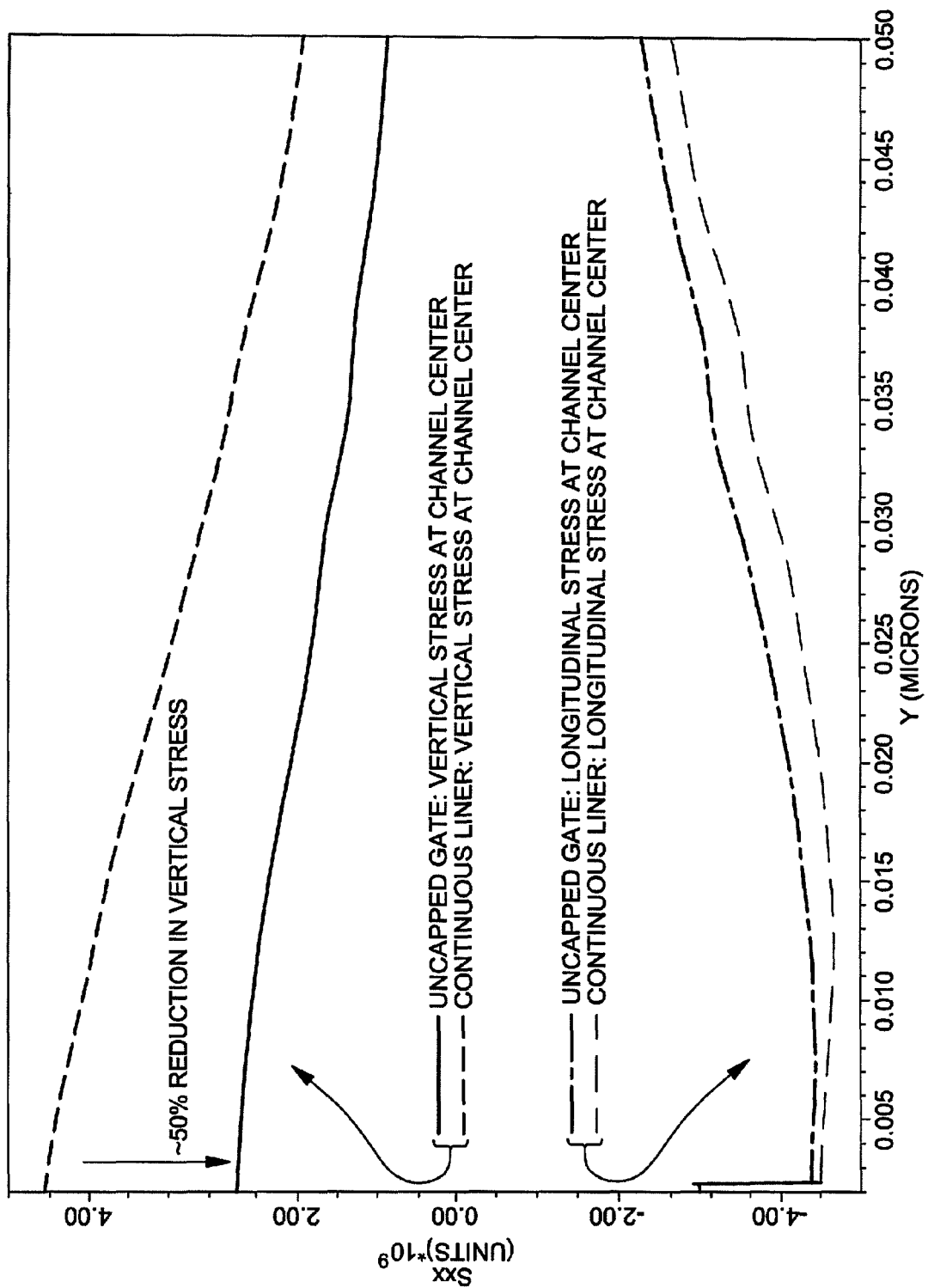
FIG. 8 is a graphical representation showing the improved results of the invention.

The improved results of the present invention are shown in the simulated structures of FIGS. 6-7. These simulations show an intermediate semiconductor NFET structure fabricated in accordance with the invention (FIGS. 6A and 7A) as compared to a control intermediate semiconductor NFET structure not processed in accordance with the invention. As shown, a compressive stress liner 40 resides over the NFET gate/spacers of the control structure, while the compressive stress liner 40 has been removed from over the NFET gate/spacers of the invention. By removing the compressive stress liner from over the NFET gate (FIGS. 6A and 6B), the vertical tensile stress, which is detrimental to NFET performance, is reduced by 50%, hence mitigating a significant amount of NFET performance loss. That is, by removing the compressive stress liner from over the NFET gates, the NFET structure of the invention has significantly reduced vertical stress (tension) in the channel (the region immediately under the gate in FIG. 6A), as compared to the control NFET, with its overlying compressive stress liner. As is shown, the control NFET has a significant amount of vertical stress in its channel (the region immediately under the gate in FIG. 6B). The beneficial results of the invention are also shown in the graph of FIG. 8, which depicts that the invention provides a 50% vertical stress reduction in the channel center. It is also noted that the longitudinal stress, from which the (001) PFET derives it's largest benefit, is only marginally affected by this structure, thus alleviating some NFET performance degradation, while maintaining PFET performance benefits of the compressive nitride liner. The impact on device performance estimates from piezoresistance calculations for the simulations of FIGS. 6A-8 are as follows: control structure PFET +18.4%, NFET −20.2%; and structure of the invention PFET +18.2%, NFET −13.8%.

Thus, by using a single stress liner and removing undesired portions over FET structures using a disposable layer the present invention easily and effectively provides a simplified structure and approach for optimizing both the PFET and the NFET performance. In particular, by using a disposable planarizing layer to expose and remove an undesired stress layer over the top of FET devices that are degraded by such stress layer, and leaving this stress layer in those regions over other FET devices that favor the stress layer for the enhanced performance of these FET devices, one can substantially reduce detrimental vertical stresss in the device channel region. Advantageously, the processing of the invention is easy and cost efficient as compared to conventional approaches that independently and separately process and optimize compressive liners over PFETs and tensile liners over NFETs.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of relieving stresses in stressed semiconductor liners comprising:
   providing a semiconductor structure having a first FET and a second FET;
   providing a single stress liner that enhances performance of said first FET;
   depositing said single stress liner over an entire surface of said semiconductor structure to cover said first and second FETs;
   depositing a disposable layer over said single stress liner;
   recessing said disposable layer to expose only the upper portion of said single stress liner over at least said second FET;
   removing said exposed single stress liner from over at least said second FET to expose a top surface of a gate of said second FET; and
   removing any remaining portions of said disposable layer, thereby enhancing performance of said first FET while avoiding degradation of said second FET.

2. The method of claim 1 wherein said second FET comprises an NFET and said first FET comprises a PFET on an (001) oriented silicon surface.

3. The method of claim 2 wherein said single stress liner comprises a single compressive stress liner for enhancement of said PFET.

4. The method of claim 3 wherein said single compressive stress liner comprises a dielectric material selected from the group consisting of silicon nitrides, silicon oxides, and the like.

5. The method of claim 1 wherein said first FET comprises an NFET and said second FET comprises a PFET on an (011) oriented silicon surface.

6. The method of claim 5 wherein said single stress liner comprises a single tensile stress liner for enhancement of said NFET.

7. The method of claim 6 wherein said single compressive stress liner comprises a dielectric material selected from the group consisting of a silicon nitride, or silicon oxide, and the like.

8. The method of claim 1 further including the step of protecting said first FET at least during said step of removing said single stress liner from over said second FET.

9. The method of claim 1 further including the step of protecting said first FET during said step of recessing said disposable layer to expose only said single stress liner over said second FET and said step of removing said single stress liner from over said second FET.

10. The method of claim 1 wherein said disposable layer comprises a material selected from the group consisting of an antireflective coating, spin-on glass, photoresist, reflowable oxides, reflow-able acrylic, and the like.

11. The method of claim 1 wherein said disposable layer is deposited to a thickness sufficient to entirely cover said single stress liner and said first and second FETs.

12. The method of claim 1 further including the step of planarizing said disposable layer.

13. The method of claim 1 further including the step of depositing a neutral stress liner over said surface of said semiconductor structure after said remaining portions of said disposable layer have been removed.

14. The method of claim 1 wherein said disposable layer is recessed down to said top surface of said gate or immediately below said top surface of said gate.

15. A method of relieving stresses in stressed semiconductor liners comprising:
providing a semiconductor structure having an NFET and a PFET;
providing a stress liner that enhances performance of either said NFET or said PFET;
depositing said single stress liner over said semiconductor structure to cover both said NFET and said PFET;
depositing a disposable layer to entirely cover said single stress liner and both said NFET and said PFET;
selectively recessing said disposable layer to expose only said single stress liner over a gate of said NFET or said PFET that is not enhanced by said single stress liner;
removing said exposed single stress liner to expose a top surface of said gate; and
removing any remaining portions of said disposable layer, thereby enhancing performance of either said NFET or said PFET while avoiding degradation of said NFET or said PFET that is not enhanced by said single stress liner.

16. The method of claim 15 wherein said single stress liner comprises a tensile stress liner for enhancement performance of said NFET.

17. The method of claim 15 wherein said single stress liner comprises a compressive stress liner for enhancement performance of said PFET.

* * * * *